United States Patent
Moosa et al.

(10) Patent No.: US 7,439,791 B2
(45) Date of Patent: Oct. 21, 2008

(54) TEMPERATURE COMPENSATION DEVICE AND METHOD THEREOF

(75) Inventors: Mohamed S. Moosa, Round Rock, TX (US); Sriram S. Kalpat, Austin, TX (US); Leo Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 305 days.

(21) Appl. No.: 11/344,511

(22) Filed: Jan. 31, 2006

(65) Prior Publication Data

US 2007/0176669 A1    Aug. 2, 2007

(51) Int. Cl.
*H01L 35/00*    (2006.01)

(52) U.S. Cl. .................... 327/512; 327/513

(58) Field of Classification Search .......... 327/512, 327/513
See application file for complete search history.

(56) References Cited

U.S. PATENT DOCUMENTS

| | | | | |
|---|---|---|---|---|
| 5,099,204 A | * | 3/1992 | Wheatley, III | 330/279 |
| 5,339,046 A | * | 8/1994 | Kornfeld et al. | 330/277 |
| 5,408,697 A | * | 4/1995 | Price et al. | 455/239.1 |
| 5,424,866 A | * | 6/1995 | Kikinis | 359/292 |
| 5,576,662 A | * | 11/1996 | Price et al. | 330/277 |
| 6,359,498 B1 | * | 3/2002 | Kurihara et al. | 327/513 |
| 6,577,190 B2 | * | 6/2003 | Kim | 330/133 |
| 6,969,656 B2 | | 11/2005 | Du et al. | |

OTHER PUBLICATIONS

Sanchez et al., "A CMOS temperature Sensor for PowerPC RISC Microprocessors," VLSI Curcuits, 1997, Digest of Technical Papers, 1997 Symposium, pp. 13-14, Jun. 12, 1997.

* cited by examiner

*Primary Examiner*—Kenneth B. Wells

(57) ABSTRACT

A device and method for temperature compensation of an electronic device are disclosed. The device includes a temperature bias controller with a temperature sensor. A bias signal based upon a signal from the temperature sensor is provided to a first gate of a multiple fin gate field effect transistor (multigate FinFET) transistor of a functional block. A second gate of the multigate FinFET transistor receives a control signal to control its operation within the functional block. In this configuration the first gate of the multigate FinFET transistor can be used for temperature compensation while the second gate is used for functional operation of the transistor. Specific embodiments of the present disclosure will be better understood with respect to the figures.

14 Claims, 3 Drawing Sheets

TEMPERATURE COMPENSATION DEVICE AND METHOD THEREOF

FIELD OF THE DISCLOSURE

The present disclosure relates to electronic devices having temperature compensation, and more particularly to electronic devices having transistor-based temperature compensation.

BACKGROUND

Many electronic components, such as transistors, are sensitive to temperature. The operating characteristics of an electronic component, such as its power consumption and switching speed can change depending on its temperature. In addition, in some electronic devices, the fact that the temperature of the device can vary over the area of the device, such as an integrated circuit, can complicate design requests. Accordingly, a transistor in one region of the integrated circuit may experience a different operating temperature, and therefore have different operating characteristics than a similar transistor in another area of the integrated circuit.

Therefore, it is desirable to provide a device that provides for compensation of the device depending on temperature.

BRIEF DESCRIPTION OF THE DRAWINGS

The present disclosure may be better understood, and its numerous features and advantages made apparent to those skilled in the art by referencing the accompanying drawings.

DESCRIPTION OF THE DRAWINGS

A device and method for temperature compensation of electronic circuitry such as a semiconductor is disclosed. The device includes a temperature bias controller that includes a temperature sensor. A bias signal based upon a signal from the temperature sensor is provided to a first gate of a multiple gate fin-type field effect transistor (multigate FinFET) of the device. A second gate of the multigate FinFET transistor receives a control signal to control its functional operation. In this configuration, the first gate of the multigate FinFET transistor can be used to bias transistors associated with functional modules for temperature compensation while the second gate of the multigate FinFET is used to control the transistors' functional operation as implemented in the functional module. Specific embodiments of the present disclosure will be better understood with respect to the figures.

Figure 1:
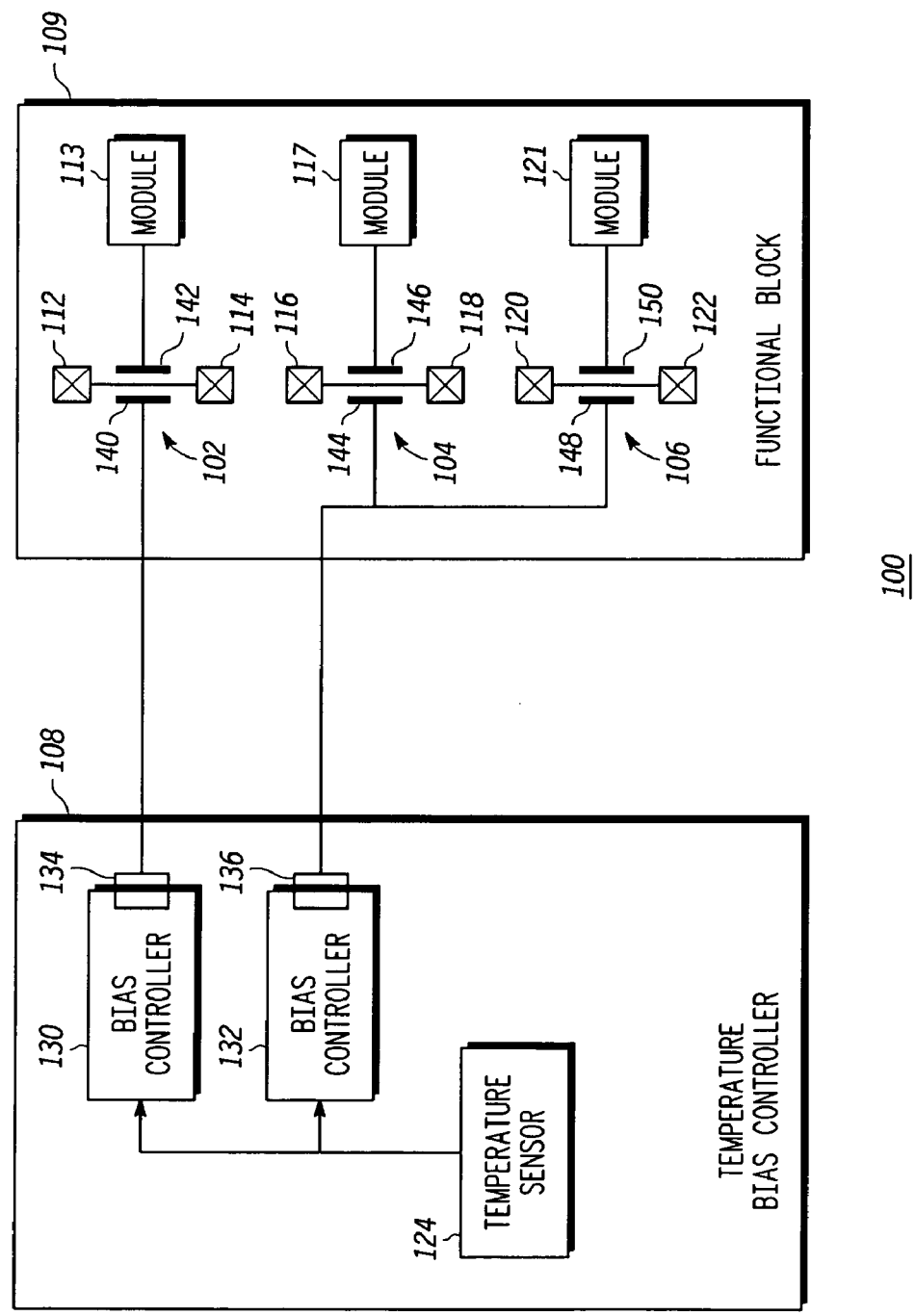
FIG. 1 includes an illustration of a block diagram of a particular embodiment of an electronic device having a temperature compensation.

FIG. 1 illustrates a temperature compensation device 100. The temperature compensation device 100 includes a functional block 109 and a temperature bias controller 108. The functional block 109 can represent one or more functional modules such as digital logic modules or analog modules. For example, a digital logic module can include central processing units, memory management units, and other logic blocks that are designed to operate in a defined manner in response to digital information received or generated at the module. Analog modules, which can include digital logic, can include analog to digital converters, digital-to-analog converters, and signal sensing modules that are designed to function in a defined manner in response to stimuli received or generated at the electronic device, such as in response to the reception of analog data or the preparation for transmission of analog data.

The functional block 109 includes a first multigate FinFET transistor 102, a second multigate FinFET transistor 104, and a third multigate FinFET transistor 106 (transistors 102-106). The first multigate FinFET transistor 102 includes a first gate electrode 140, a second gate electrode 142 and source/drain electrodes (current electrodes) 112 and 114. The second multigate FinFET transistor 104 includes a first gate electrode 144, a second gate electrode 146, and source/drain electrodes 116 and 118. The third multigate FinFET transistor 106 includes a first gate electrode 148, a second gate electrode 150, and source/drain electrodes 120 and 122. The functional block 109 also includes a first functional control module 113, a second functional control module 117, and a third functional control module 121.

The second gate electrode 142 of the first multigate FinFET transistor 102 is connected to the first functional control module 113, the second gate 146 of the second multigate FinFET transistor 104 is connected to the second functional control module 117, and the second gate electrode 150 of the third multigate FinFET transistor 106 is connected to the third functional control module 121. It will be appreciated that functional control modules 113, 117, and 121 represent those portions of functional block 109 that control transistors 102, 104, and 106, respectively. Although the functional control modules 113, 117 and 121 are illustrated separately in FIG. 1, it will be appreciated that a functional control module 113, 117, or 121 may include some or all of the same logic elements as another functional control module 113, 117, or 121. It will further be appreciated that, transistors 102-106 are connected to other components or modules. For example, the source/drain electrodes 112 and 114 of the first multigate FinFET transistor 102 are connected to other components of functional block 109, the source/drain electrode 116 and 188 of the second multigate FinFET transistor 104 are connected to other components of functional block 109, and the source/drain electrodes 120 and 122 of the third multigate FinFET transistor 106 are connected to other components of functional block 109.

The temperature bias controller 108 includes a first temperature sensor 124, a first bias control circuit 130 having an illustrated output 134, and a second bias control circuit 132 having an illustrated output 136.

The first gate electrode 140 of the first multigate FinFET transistor 102 is connected to the first bias output 134 of the temperature bias controller 108. The first gate 144 of the second multigate FinFET transistor 104 is connected to the second bias output 136 of the temperature bias controller 108. The first gate 148 of the third multigate FinFET transistor 106 is also connected to the second bias output 136.

It will be appreciated that FIG. 1 illustrates multiple transistors within functional block 109, as well as multiple bias controllers within the temperature bias controller 108 for purposes of discussion. However, it will further be appreciated that the scope of the present disclosure is not limited to electronic devices having the number of transistors or bias controllers as illustrated in FIG. 1, and that the devices having more or fewer transistors and bias controllers are also anticipated herein.

The bias control circuit 130 and the second bias control circuit 132 are each responsive to a temperature sensitive signal of the first temperature sensor 124. For this reason, even though the bias controller 130 and bias controller 132 receive the same signal from temperature sensor 124, they need not necessarily provide the same bias signal at their outputs. This allows for components or circuits having different temperature sensitivities to be biased differently even though only one temperature is sensed.

The transistors 102-106 each include a first gate electrode and a second gate electrode. As discussed further with respect to FIG. 4, each of the gate electrodes of transistors 102-106 may be used to control current flow of its transistor. For example, with respect to the first multigate FinFET transistor 102, the current flow from one current electrode to the other current electrode can be controlled based upon signals at the first gate electrode 140 and the second gate electrode 142. Accordingly, in response to a bias voltage applied at the first gate electrode 140 and a control signal applied at the second gate electrode 142, current can flow through the FinFET transistor 102. Functional control module 113 of the functional block 109 controls the functional operation of the transistor 102, e.g., its high-level operation relative to operation of other transistors of functional block 109, while a bias voltage at the first gate electrode can control low-level operating behavior of transistor 102.

Therefore, by controlling the bias voltage at the first gate electrode 140, the operating behavior of how the first multigate FinFET transistor responds to control signals at the second gate electrode 142 may be compensated for over temperature to assure its functional operation within functional block 104. This can assure that the control signal from control portion 113 affects transistor 102 in a manner that facilitates functional operation, independent of temperature, of circuits and modules to which transistor 102 is a member. Previous methods of using single gate transistors can be more complex than the disclosed technique using multigate FinFETs, in that the functional signals are generally modified with previous techniques. The use of a separate gate of a multigate FinFET to perform temperature compensation allows for finer temperature control and simplified designs.

The temperature bias controller 108 can employ multiple bias control circuits, including the first bias control circuit 130 and the second bias control circuit 132. A bias output can be associated with each bias control circuit to provide a temperature bias signal to one or more multigate FinFET transistors. For example, as illustrated, the first bias control circuit 130 provides a temperature bias signal at a bias output represented by output 134 of the first bias control circuit 130. This temperature bias signal is provided to the first transistor 102, while the second bias control circuit 132 provides a different bias control signal at a bias output represented by output 136 of bias controller 132, to multigate FinFET transistors 104 and 106. This allows for different temperature compensation for different groups of multigate FinFET transistors, or even for individual transistors. The availability of different bias signals can be useful when transistors (or individual transistors) respond to temperature variations differently or if they are associated with modules that have different temperature dependent characteristics. For example, the first multigate FinFET transistor 102 can be a transistor having different temperature dependent characteristics than the second and third multigate FinFET transistors 104 and 106. As such, FinFET transistor 102 may require different temperature compensation than FinFET transistors 104 and 106. Alternatively, transistors 102, 104, and 106 may have the same temperature dependent characteristics, however, transistor 102 is part of a delay path having a specific temperature dependent characteristic, such as delay path that affects a race condition, while transistors 104 and 106 are part of a different delay path that does not affect a race condition. In either case, the ability to compensate for temperature variations is useful.

Figure 2:
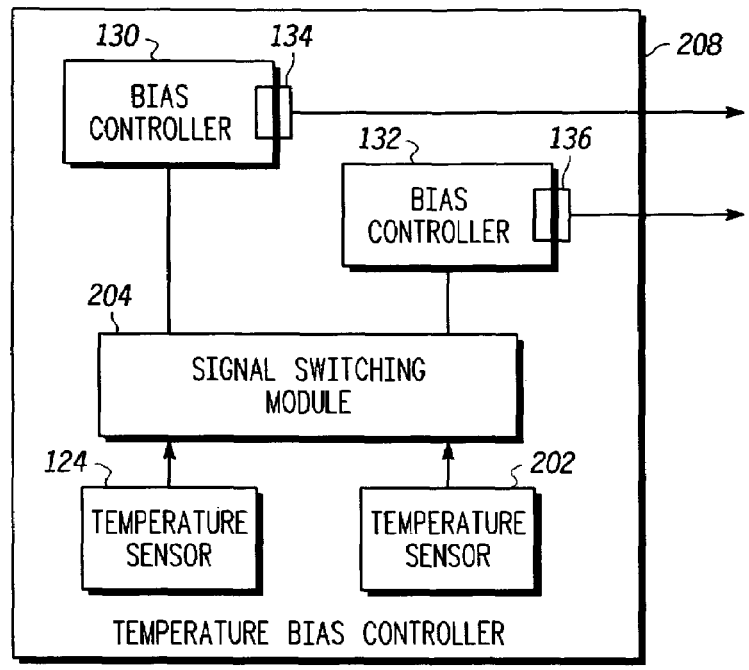
FIG. 2 is a block diagram of an alternative embodiment of a temperature bias controller of FIG. 1.

Referring to FIG. 2, an alternative embodiment of a temperature bias controller 208 is illustrated that can be used in place of temperature bias controller 108 in the device of FIG. 1. FIG. 2 includes similar components as FIG. 1, and is therefore similarly numbered and is understood to have similar functions, unless otherwise noted. The temperature bias controller 208 further includes a second temperature sensor 202 and a signal switching module 204. The signal switching module 204 is connected to the first and second temperature sensors 124 and 202 to receive input signals. Signal switching modules 204 provides these signals to the first and second bias control circuits 130 and 132.

The temperature bias controller 208 uses the temperature sensors 124 and 202 to provide a bias signal at outputs 134 and 136, the bias outputs, based upon a detected a temperature. The temperature sensors 124 and 202 may be of different types that use different temperature sensing techniques. For example, the first temperature sensor 124 may be an active temperature sensor and the second temperature sensor 202 may be a passive temperature sensor. The temperature sensors 124 and 202 may be located at the same location of the integrated circuit, or at different locations of the integrated circuit. It will be appreciated that it is not inherently possible for two physically different temperature sensors to be located at the same location, however for purposes herein, temperature sensors referred to as being at the same location are defined to be temperature sensors located in close proximity to one another, such that no significant temperature differences would be anticipated between the two locations.

The signal switching module 204 may be used to control which bias control circuit is responsive to a particular temperature sensor. A select signal (not shown) may be applied to the signal switching module 204 to electrically couple or decouple the temperature sensors 124 and 202 to the bias control circuits 130 and 132. The control signal may be provided by a central processing unit, a control module, or other module. In addition, the signal switching module 204 may be controlled so that the temperature sensor electrically coupled to a particular bias control circuit changes over time. For example, the temperature compensation device 100 may be incorporated in a device that includes a low-power mode and a normal-power mode. In the low power mode, the signal switching module 204 is controlled so that the first bias control circuit 130 and the second bias control circuit 132 are both responsive to temperature sensor 124, which may be a passive temperature sensor, thereby conserving power. When the device is placed in a normal power mode, the signal switching module 204 is controlled so that the first bias control circuit 130 and the second bias control circuit 132 are both responsive to temperature sensor 202, which may be an active temperature sensor. Note that bias controllers 130 and 132 need not be electrically coupled to the same temperature sensor.

Figure 3:
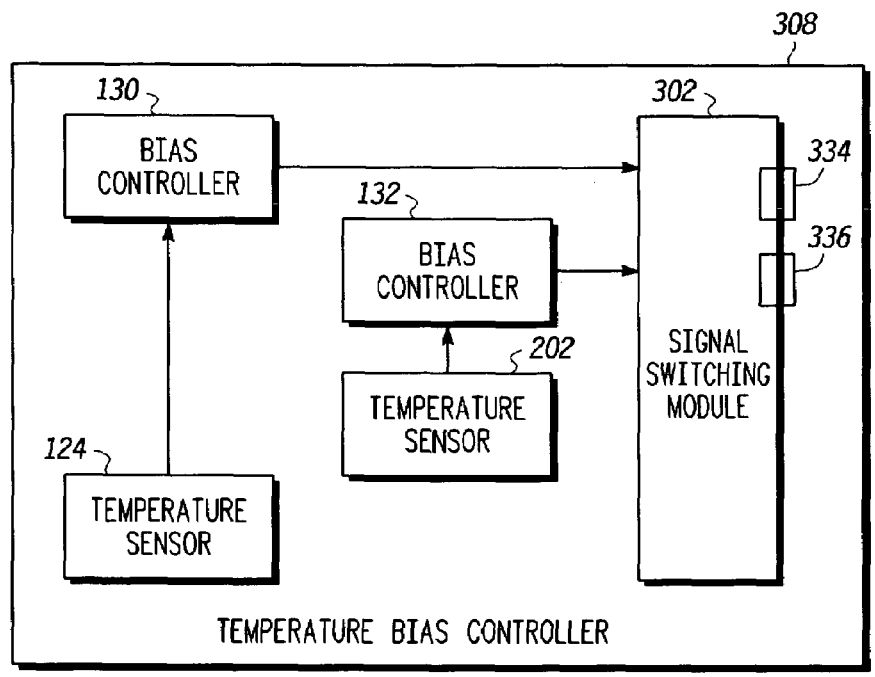
FIG. 3 is a block diagram of an alternative embodiment of a temperature bias controller of FIG. 1.

Referring to FIG. 3, another particular embodiment of a temperature bias controller 308 is illustrated. The temperature bias controller 308 includes similar components as the controller of FIG. 2, though a different signal switching module 302 having outputs 334 and 336 is illustrated. The signal switching module 302 includes inputs that are connected to outputs of the first bias controller 130 and the second bias controller 132 to receive biasing signals. In addition, in the configuration illustrated in FIG. 3, the first bias controller 130 is connected to be responsive to the first temperature sensor 124 and the second bias controller 132 is connected to be responsive to the second temperature sensor 202.

During operation, the signal switching module 302 may be controlled to selectively connect the first and second bias controllers 130 and 132 to the first and second bias outputs 334 and 336, respectively, or to selectively connect one of the first and second bias controller to both of the first and second bias outputs 334 and 336. The signal switching module 302 may be controlled via a control signal at a register, or controlled by a central processing unit, control module, or other appropriate module. In addition, the signal switching module 302 may be used to control which bias control circuit and associated temperature sensor are connected to a particular multigate FinFET transistor. As explained with respect to FIG. 2, this may be useful in different applications.

Figure 4:
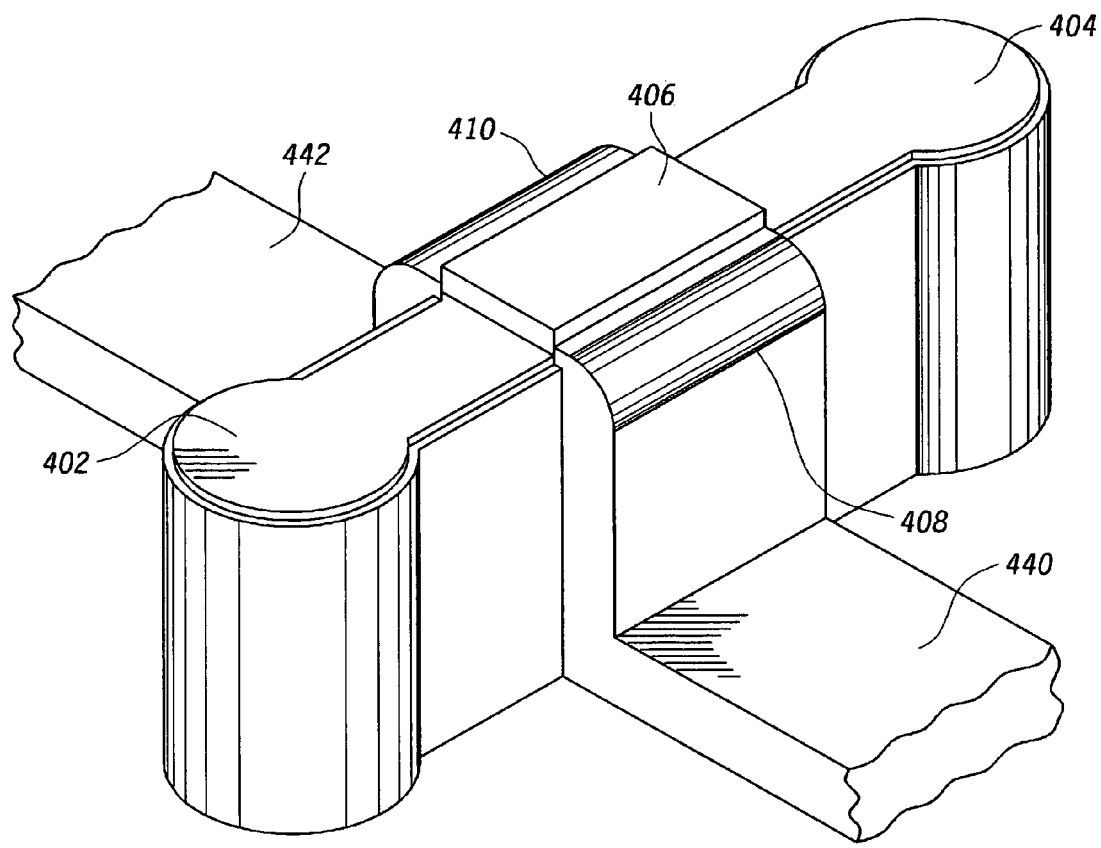
FIG. 4 is a block diagram of a particular embodiment of a multigate FinFET transistor that may be used in conjunction with the electronic device of FIG. 1.

Referring to FIG. 4, a particular embodiment of a multigate FinFET transistor, such as the transistors 102, 104, and 106, is illustrated in FIG. 1. The multigate FinFET transistor includes a first gate electrode 440, and a second gate electrode 442, and a fin structure having source/drain regions 402 and 404, and a channel region between the two source/drain regions. The first gate electrode 440 overlies a first channel region at one side of a fin structure, while the second gate electrode 440 overlies a second channel region at an opposing side of the fin structure.

During operation, a bias signal may be applied at the first gate electrode 140. In response, carriers are attracted to the first channel region underlying the first gate electrode 440 and can result in current flowing between the source/drain regions 402 and 404. Depending on a value of the bias signal, no substantial current need flow from the source/drain region 402 to the source/drain region 404. However, even when no substantial current flows, the bias signal can affect the operation of the transistor with respect to control signals received at gate 442.

Figure 5:
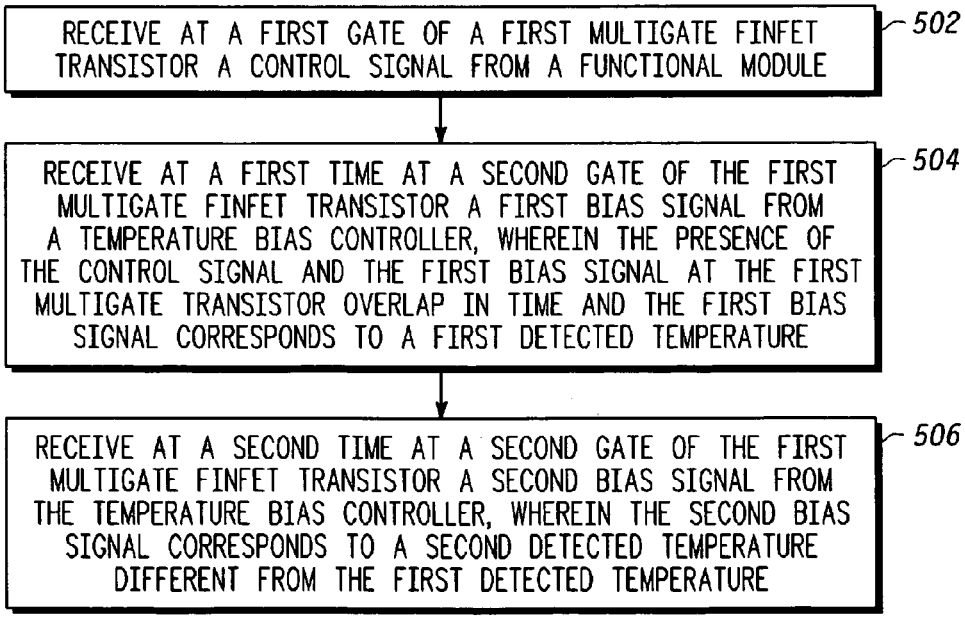
FIG. 5 is a flow chart of a method in accordance with a specific embodiment of the present disclosure.

Referring to FIG. 5, a method of receiving a voltage at a multigate FinFET transistor is illustrated. At block 502, a first signal is received at a first gate of a first multigate FinFET transistor. The first signal is received from a functional electronic module, and may be a signal controlling the functional operation of the multigate FinFET transistor. For example, if the multigate FinFET transistor is being used in a digital logic circuit, the received signal will be a digital logic signal.

Proceeding to block 504, a second signal is received at a second gate of the first multigate FinFET transistor. This second signal is received from a bias output of a temperature bias controller at a first time, and corresponds to a first detected temperature level. This signal affects the behavior or response of the multigate FinFET transistor to the first signal. For example, the signal received at the second gate provides a bias signal that can be adjusted based on the detected temperature to affect how the transistor responds to a control signal at the first gate. Therefore, an adjustment of the bias signal can change the response of the multigate FinFET transistor in such a way that the transistor responds to functional control signals received at the first gate of the multigate FinFET transistor to assure normal operation of the transistor. For example, the bias signal can affect how quickly the transistor turns on.

At block 506, a third signal is received at a second time at the second gate of the first multigate FinFET transistor. This third signal is a bias signal also received from the temperature bias controller, and corresponds to a detected temperature level at a time that is different from the first time. Thus, the signals received at the second gate of the multigate FinFET transistor may be adjusted over time as the detected temperature level changes. These signals are used to facilitate operation of the multigate FinFET transistor via the first gate of the transistor.

A device and method for temperature compensation are disclosed. The device includes a temperature bias controller with a first temperature sensor coupled to a first bias output of the temperature bias controller and a first multigate FinFET transistor comprising a first gate and a second gate. The second gate is coupled to the first bias output of the temperature bias controller.

In one particular aspect, the first gate of the first multigate FinFET transistor is coupled to a first functional control module. In another particular aspect, the device includes a second multigate FinFET transistor including a first gate and a second gate. The second gate of the second multigate FinFET is coupled to the first bias output of the temperature bias controller.

In still another particular aspect, the temperature bias controller further comprises a second bias output coupled to the first temperature sensor. The first bias output is to provide a first bias signal and the second bias output is to provide a second bias signal. The device also includes a second multigate FinFET transistor including a first gate and a second gate. The second gate of the second multigate FinFET is coupled to the second bias output of the temperature bias controller.

In another particular aspect, the temperature bias controller further comprises a first bias controller comprising an input coupled to the first temperature sensor and an output coupled to the first bias output of the temperature bias controller. In a particular aspect, the first temperature sensor is an active temperature sensor.

In yet another particular aspect, the temperature bias controller further comprises a first bias controller comprising an input coupled to the first temperature sensor and the first bias output, and a second bias controller comprising an input coupled to the first temperature sensor and a second bias output. The device also includes a second multigate FinFET transistor including a first gate and a second gate. The second gate of the second multigate FinFET is coupled to the second bias output of the temperature bias controller.

In a particular aspect, the temperature bias controller further comprises a second temperature sensor coupled to a second bias output of the temperature bias controller. The device further comprises a second multigate FinFET transistor including a first gate and a second gate. The second gate of the second multigate FinFET is coupled to the second bias output of the temperature bias controller.

In another particular aspect the first temperature sensor is located closer to the first multigate FinFET transistor than the second multigate FinFET transistor FINFET. In a particular aspect, the first temperature sensor is an active temperature sensor and the second temperature sensor is a passive temperature sensor.

In still another particular aspect the temperature bias controller further comprises a third bias output coupled to the second temperature sensor, and the device further comprises a third multigate FinFET transistor including a first gate and a second gate. The second gate of the third multigate FinFET transistor is coupled to the second bias output of the temperature bias controller.

In yet another particular aspect, the temperature bias controller further comprises a second temperature sensor coupled to the first bias output of the temperature bias controller, and a signal switching module to selectively electronically couple one of the first temperature sensor and the second temperature sensor to the first bias output.

In another particular aspect, the temperature bias controller further comprises a first bias controller comprising an input coupled to the first temperature sensor, a second bias controller comprising an input coupled to the first temperature sensor, and a signal switching module to selectively electronically couple one of the first bias controller the second bias controller to the first bias output of the temperature bias controller.

In still another particular aspect, the temperature bias controller further comprises a second temperature sensor, a first bias controller comprising an input coupled to the first temperature sensor, a second bias controller comprising an input coupled to the second temperature sensor, and a signal switching module to selectively couple one of the first bias controller and the second bias controller to the first bias output of the temperature bias controller.

The method includes receiving at a first gate of a first multigate FinFET transistor a first signal from a functional electronic module and receiving at a first time at a second gate of the first multigate FinFET transistor a first bias signal from a temperature bias controller. The presence of the control signal and the first bias signal at the multigate transistor overlap in time. The first bias signal corresponds to a first detected temperature.

In a particular aspect, the method includes receiving at a second time at the second gate of the first multigate FinFET transistor a second bias signal from the temperature bias controller. The second bias signal corresponds to a second detected temperature level different from the first.

In another particular aspect, the method includes receiving at the first time the first bias signal at a first gate of a second multigate FinFET transistor.

In still another particular aspect, the method includes receiving at the first time a second bias signal from the temperature bias controller at a first gate of a second multigate FinFET transistor, the second bias signal indicating a second detected temperature level. In a particular aspect, the method includes generating the first bias signal based on one of a plurality of temperature sensors; and generating the second bias signal based on a second of the plurality of temperature sensors. In yet another particular aspect, the method includes selecting one of a plurality of temperature sensors for generating the first bias signal.

While the principles of the invention have been described above in connection with specific apparatus, it is to be clearly understood that this description is made only by way of example and not as a limitation on the scope of the invention. For example, other embodiments are anticipated. In one embodiment, multigate transistors other that FinFETs, such as planar transistors can be utilized. In yet another embodiment, the functional control modules described herein can include multiplexers that select one or more control signals to be provided to their respective transistors.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

What is claimed is:

1. An electronic device, comprising:
   a temperature bias controller comprising a first temperature sensor coupled to a first bias output of the temperature bias controller, and a second temperature sensor coupled to a second bias output of the temperature bias controller;
   a first multigate FinFET transistor comprising a first gate and a second gate, the second gate coupled to the first bias output of the temperature bias controller; and
   a second multigate FinFET transistor including a first gate and a second gate, the second gate coupled to the second bias output of the temperature bias controller.

2. The electronic device of claim 1, wherein the first gate of the first multigate FinFET transistor is coupled to a first functional control module.

3. The electronic device of claim 1, wherein the temperature bias controller further comprises a first bias controller comprising an input coupled to the first temperature sensor and the first bias output of the temperature bias controller.

4. The electronic device of claim 1, wherein the first temperature sensor is an active temperature sensor.

5. The electronic device of claim 1, wherein the first temperature sensor is located closer to the first multigate FinFET transistor than to the second multigate FinFET transistor.

6. The electronic device of claim 1, wherein the first temperature sensor is an active temperature sensor and the second temperature sensor is a passive temperature sensor.

7. The electronic device of claim 1 wherein the temperature bias controller further comprises a third bias output coupled to the second temperature sensor; and the device further comprising:
   third multigate FinFET transistor including a first gate and a second gate, the second gate coupled to the second bias output of the temperature bias controller.

8. An electronic device, comprising:
   a temperature bias controller comprising a first temperature sensor coupled to a first bias output of the temperature bias controller, a second temperature sensor coupled to the first bias output of the temperature bias controller, and a signal switching module to selectively electronically couple one of the first temperature sensor and the second temperature sensor to the first bias output; and
   first multigate FinFET transistor comprising a first gate and a second gate, the second gate coupled to the first bias output of the temperature bias controller.

9. An electronic device, comprising:
   temperature bias controller comprising a first temperature sensor, a first bias controller comprising an input coupled to the first temperature sensor, a second bias controller comprising an input coupled to the first temperature sensor, a signal switching module to selectively electronically couple one of the first bias controller and the second bias controller to a first bias output of the temperature bias controller; and
   a first multigate FinFET transistor comprising a first gate and a second gate, the second gate coupled to the first bias output of the temperature bias controller.

10. The electronic device of claim 9, wherein the temperature bias controller further comprises:
    second temperature sensor.

11. A method, comprising:
    receiving at a first gate of a first multigate FinFET transistor a control signal from a functional module;

selecting one of a plurality of temperature sensors for generating the first bias signal; and receiving at a first time at a second gate of the first multigate FinFET transistor a first bias signal from a temperature bias controller, wherein the presence of the control signal and the first bias signal at the first multigate FinFET transistor overlap in time and the first bias signal corresponds to a first detected temperature.

12. The method of claim 11, further comprising:

receiving at a second time at the second gate of the first multigate FinFET transistor a second bias signal from the temperature bias controller, wherein the second bias signal corresponds to a second detected temperature different from the first detected temperature.

13. The method of claim 11, further comprising receiving at the first time the first bias signal at a first gate of a second multigate FinFET transistor.

14. The method of claim 11, further comprising:

receiving at the first time a second bias signal from the temperature bias controller at a first gate of a second multigate FinFET transistor, the second bias signal indicating a second detected temperature level.

* * * * *